(12) United States Patent
Fuerhoff et al.

(10) Patent No.: US 6,171,391 B1
(45) Date of Patent: Jan. 9, 2001

(54) METHOD AND SYSTEM FOR CONTROLLING GROWTH OF A SILICON CRYSTAL

(75) Inventors: Robert H. Fuerhoff, St. Charles; Mohsen Banan, Grover, both of MO (US)

(73) Assignee: Memc Electronic Materials, Inc., St. Peters, MO (US)

( * ) Notice: Under 35 U.S.C. 154(b), the term of this patent shall be extended for 0 days.

(21) Appl. No.: 09/172,546

(22) Filed: Oct. 14, 1998

(51) Int. Cl.$^7$ .................................................. C30B 15/26
(52) U.S. Cl. .............................. 117/14; 117/15; 117/201; 117/202; 117/217
(58) Field of Search ................................ 117/14, 15, 201, 117/202, 217

(56) References Cited

U.S. PATENT DOCUMENTS

| 3,740,563 | 6/1973 | Reichard .......................... 250/222 R |
| 4,350,557 | 9/1982 | Scholl et al. ......................... 156/601 |
| 4,710,258 | 12/1987 | Latka ................................. 156/601 |
| 4,926,357 | * 5/1990 | Katsuoka et al. ....................... 117/15 |
| 5,138,179 | 8/1992 | Baba et al. ............................ 250/560 |
| 5,170,061 | 12/1992 | Baba .................................. 250/561 |
| 5,178,720 | 1/1993 | Frederick .......................... 156/618.1 |
| 5,183,528 | 2/1993 | Baba et al. ........................... 156/601 |
| 5,240,684 | 8/1993 | Baba et al. ........................... 422/249 |
| 5,286,461 | 2/1994 | Koziol et al. ......................... 422/249 |
| 5,288,363 | 2/1994 | Araki ................................. 156/601 |
| 5,378,900 | 1/1995 | Hirano et al. ......................... 117/201 |
| 5,437,242 | 8/1995 | Hofstetter et al. ..................... 117/14 |
| 5,653,799 | 8/1997 | Fuerhoff ............................. 117/14 |
| 5,665,159 | 9/1997 | Fuerhoff ............................. 117/201 |
| 5,846,318 | 12/1998 | Javidi ................................ 117/14 |
| 5,868,831 | * 2/1999 | Dornbreger et al. .................. 117/15 |

FOREIGN PATENT DOCUMENTS

| 0450502A | 10/1991 | (EP) | ............................ C30B 15/26 |
| 63-239181 | 10/1988 | (JP) | ............................ C30B 15/26 |
| 63-256594 | 10/1988 | (JP) | ............................ C30B 15/26 |
| 3112885A | 10/1991 | (JP) | ............................ C30B 15/26 |
| 4300283A | 10/1992 | (JP) | ............................ C30B 15/20 |
| 08-239668 | 2/1998 | (JP) . | |

OTHER PUBLICATIONS

Gonzalez and Wintz, Digital Image Processing, 1987, pp. 36–52.
T. E. Faber, Fluid Dynamics for Physicists, 1995, p. 42.

* cited by examiner

*Primary Examiner*—Robert Kunemund
(74) *Attorney, Agent, or Firm*—Senniger, Powers, Leavitt & Roedel

(57) ABSTRACT

A method and system for determining melt level and reflector position in a Czochralski single crystal growing apparatus. The crystal growing apparatus has a heated crucible containing a silicon melt from which the crystal is pulled. The crystal growing apparatus also has a reflector positioned within the crucible with a central opening through which the crystal is pulled. A camera generates images of a portion of the reflector and a portion of a reflection of the reflector visible on the top surface of the melt. An image processor processes the images as a function of their pixel values to detect an edge of the reflector and an edge of the reflection in the images. A control circuit determines a distance from the camera to the reflector and a distance from the camera to the reflection based on the relative positions of the detected edges in the images. The control circuit determines at least one parameter representative of a condition of the crystal growing apparatus based on the determined distances and controls the apparatus in response to the determined parameter.

18 Claims, 8 Drawing Sheets

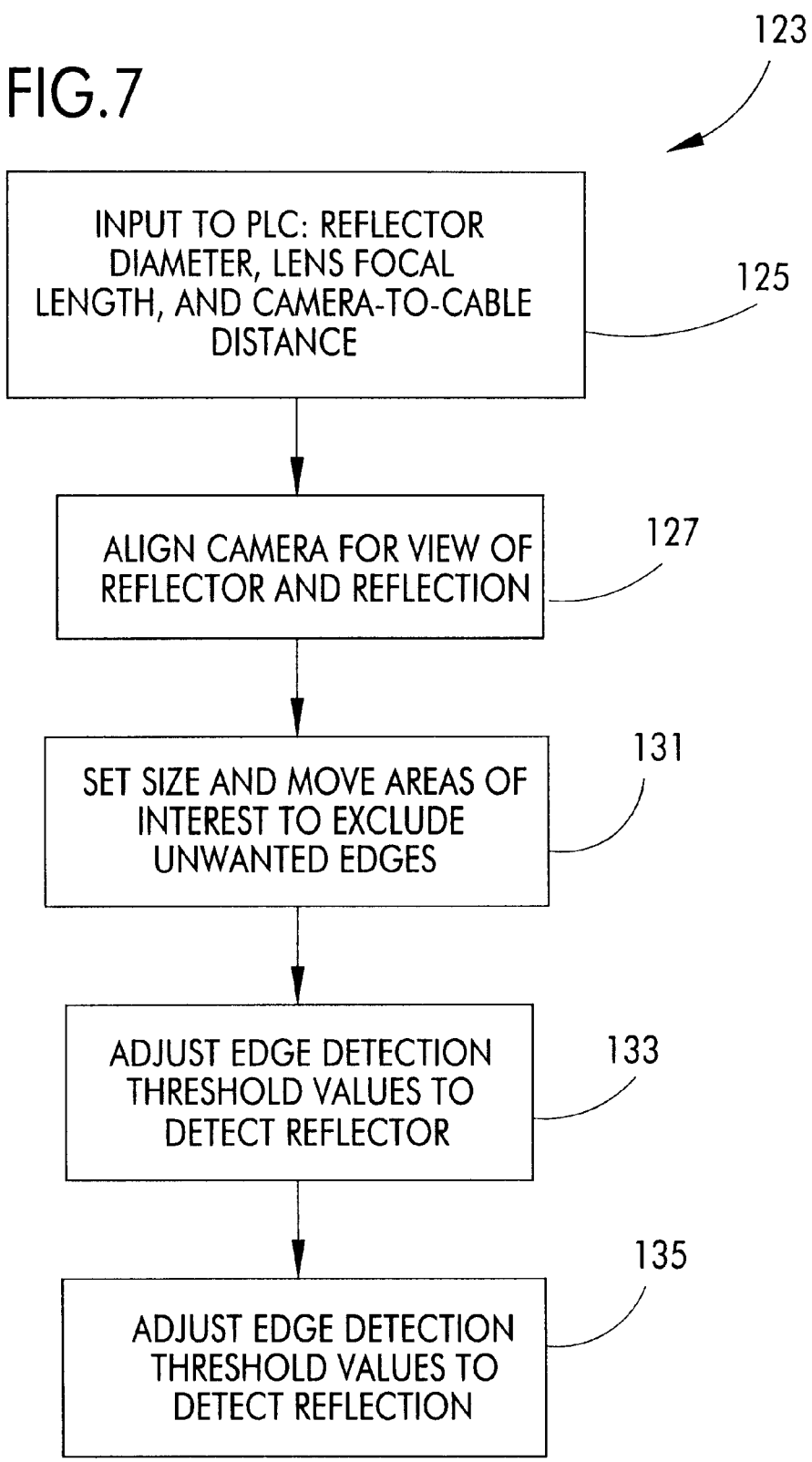

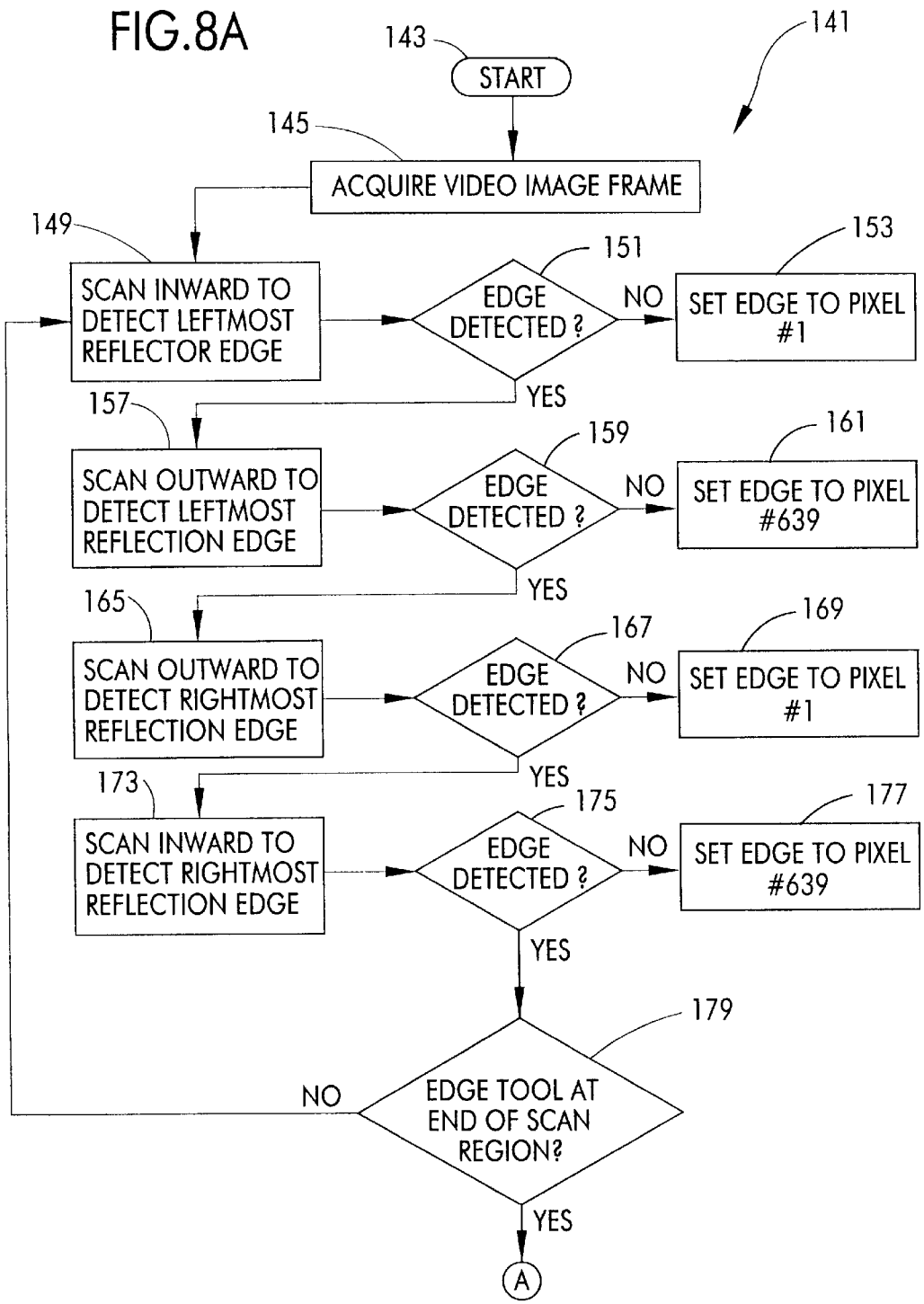

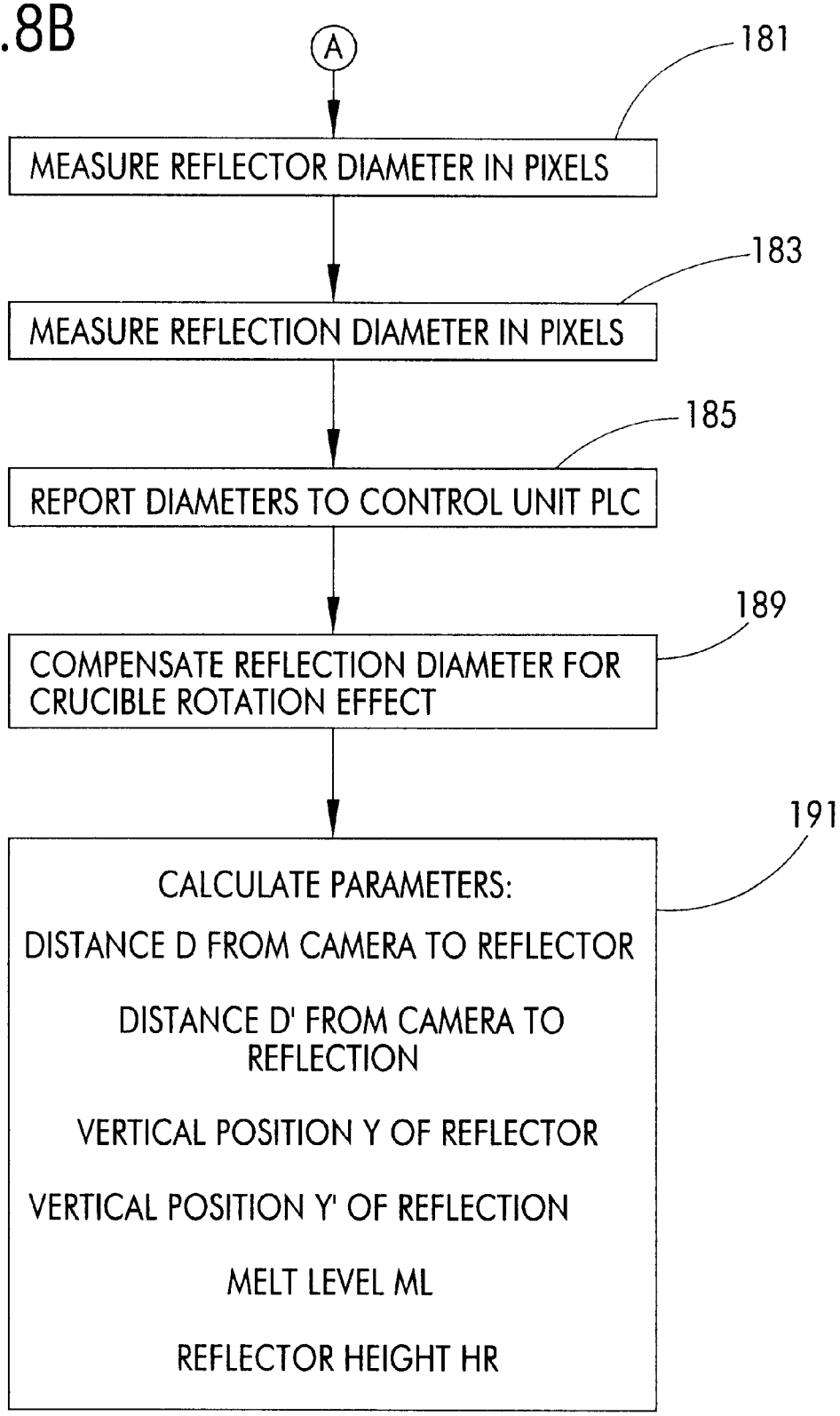

METHOD AND SYSTEM FOR CONTROLLING GROWTH OF A SILICON CRYSTAL

BACKGROUND OF THE INVENTION

This invention relates generally to improvements in controlling silicon crystal growth processes and, particularly, to a vision system and method for measuring melt level in a Czochralski silicon crystal growth process for use in controlling the growth process.

Single crystal, or monocrystalline, silicon is the starting material in most processes for fabricating semiconductor electronic components. Crystal pulling machines employing the Czochralski process produce the majority of single crystal silicon. Briefly described, the Czochralski process involves melting a charge of high-purity polycrystalline silicon in a quartz crucible located in a specifically designed furnace. After the silicon in the crucible is melted, a crystal lifting mechanism lowers a seed crystal into contact with the molten silicon. The mechanism then withdraws the seed to pull a growing crystal from the silicon melt.

After formation of a crystal neck, the typical process enlarges the diameter of the growing crystal by decreasing the pulling rate and/or the melt temperature until a desired diameter is reached. By controlling the pull rate and the melt temperature while compensating for the decreasing melt level, the main body of the crystal is grown so that it has an approximately constant diameter (i.e., it is generally cylindrical). Near the end of the growth process but before the crucible is emptied of molten silicon, the process gradually reduces the crystal diameter to form an end cone. Typically, the end cone is formed by increasing the crystal pull rate and heat supplied to the crucible. When the diameter becomes small enough, the crystal is then separated from the melt. During the growth process, the crucible rotates the melt in one direction and the crystal lifting mechanism rotates its pulling cable, or shaft, along with the seed and the crystal in an opposite direction.

The Czochralski process is controlled in part as a function of the level of molten silicon in the crucible. Thus, an accurate and reliable system for measuring melt level during the different phases of crystal growth is needed to ensure crystal quality. Commonly assigned U.S. Pat. Nos. 5,665, 159 and 5,653,799 and U.S. application Ser. No. 08/896,177 (allowed), the entire disclosures of which are incorporated herein by reference, provide accurate and reliable measurements of a number of crystal growth parameters, including melt level. In these patents, an image processor processes images of the crystal-melt interface to determine the melt level.

U.S. Pat. Nos. 3,740,563 and 5,286,461, the entire disclosures of which are incorporated herein by reference, also disclose means for measuring melt level. A moving, closed loop electro optical system provides a melt level measurement in U.S. Pat. No. 3,740,563 and detection of a reflected laser beam provides a melt level measurement in U.S. Pat. No. 5,286,461.

Although presently available Czochralski growth processes have been satisfactory for growing single crystal silicon useful in a wide variety of applications, further improvements are still desired. For example, hot zone apparatus are often disposed within the crucible to manage thermal and/or gas flow. For control purposes, it is often desirable to measure the melt level relative to the hot zone apparatus and to measure the position of different hot zone parts relative to each other.

One known method predicts the position of a reflector, for example, based on the "stack up" of the dimensions and tolerances of multiple supporting parts. However, most of these parts are susceptible to thermal expansion and, thus, the actual position of the reflector is not known to the accuracy required for satisfactory product quality. Another common practice is to suspend a quartz pin of known length from the reflector. Moving the crucible until the melt touches the pin establishes the position of the reflector with respect to the melt. However, this incurs additional fabrication costs, introduces another process step and requires greater diligence during puller setup and cleanup to correctly install and use the pin without damaging it.

U.S. Pat. No. 5,437,242, the entire disclosure of which is incorporated herein by reference, discloses directly determining the distance between the reflector and its reflection in the melt. Unfortunately, the method of this patent is incapable of providing the reflector position. Also, this method requires a mechanical reference mark in the reflector having the shape of, for example, a triangle, quadrangle or circle. In this instance, the mark obscures the view of the far edge of the reflector and its reflection and incurs additional fabrication costs. Using a mechanical reference mark in the reflector also requires greater diligence during puller setup to align the mark correctly and affects the thermal and gas flow properties of the reflector itself.

For these reasons, an improved system and method for the measurement and control of melt levels and the positions of hot zone parts in the Czochralski process, without additional setup procedures and processing steps and without additional consumable parts, is desired.

SUMMARY OF THE INVENTION

The invention meets the above needs and overcomes the deficiencies of the prior art by providing an improved method and system of control and operation. This is accomplished by a vision system that performs edge detection routines to detect the positions of hot zone apparatus and the reflections of such hot zone apparatus on the top surface of a melt. Advantageously, the invention determines the position of the hot zone apparatus relative to a reference and relative to the melt and also determines the level of the melt relative to a reference. In addition, such method can be carried out efficiently and economically and such system is economically feasible and commercially practical.

Briefly described, a method embodying aspects of the present invention is for use with an apparatus for growing a silicon single crystal. The crystal growing apparatus has a heated crucible containing a silicon melt from which the crystal is pulled. The crystal growing apparatus also has a reflector positioned within the crucible with a central opening through which the crystal is pulled. The method begins with the step of generating images of a portion of the reflector and a portion of a reflection of the reflector visible on the top surface of the melt with a camera. The method also includes processing the images as a function of their pixel values to detect an edge of the reflector and an edge of the reflection in the images. In this instance, the edge of the reflection corresponds to a virtual image of the reflector. The method further includes the step of determining a distance from the camera to the reflector and a distance from the camera to the virtual image of the reflector based on the relative positions of the detected edges in the images. At least one parameter representative of a condition of the crystal growing apparatus is determined based on the determined distances for controlling the crystal growing apparatus.

Generally, another form of the invention is a system for use with an apparatus for growing a silicon single crystal. The crystal growing apparatus has a heated crucible containing a silicon melt from which the crystal is pulled. The crystal growing apparatus also has a reflector positioned within the crucible with a central opening through which the crystal is pulled. The system includes a camera for generating images of a portion of the reflector and a portion of a reflection of the reflector visible on the top surface of the melt. An image processor processes the images as a function of their pixel values to detect an edge of the reflector and an edge of the reflection in the images. In this instance, the edge of the reflection corresponds to a virtual image of the reflector. The system also includes a control circuit for determining a distance from the camera to the reflector and a distance from the camera to the virtual image of the reflector based on the relative positions of the detected edges in the images. The control circuit determines at least one parameter representative of a condition of the crystal growing apparatus based on the determined distances and controls the apparatus in response to the determined parameter.

Alternatively, the invention may comprise various other methods and systems.

Other objects and features will be in part apparent and in part pointed out hereinafter.

BRIEF DESCRIPTION OF THE DRAWINGS

FIG. 7 illustrates an exemplary flow diagram of an initialization routine for the system of FIG. 1.

FIGS. 8A and 8B illustrate an exemplary flow diagram of the operation of the control unit of FIG. 2.

Corresponding reference characters indicate corresponding parts throughout the drawings.

DETAILED DESCRIPTION OF PREFERRED EMBODIMENTS

Figure 1:
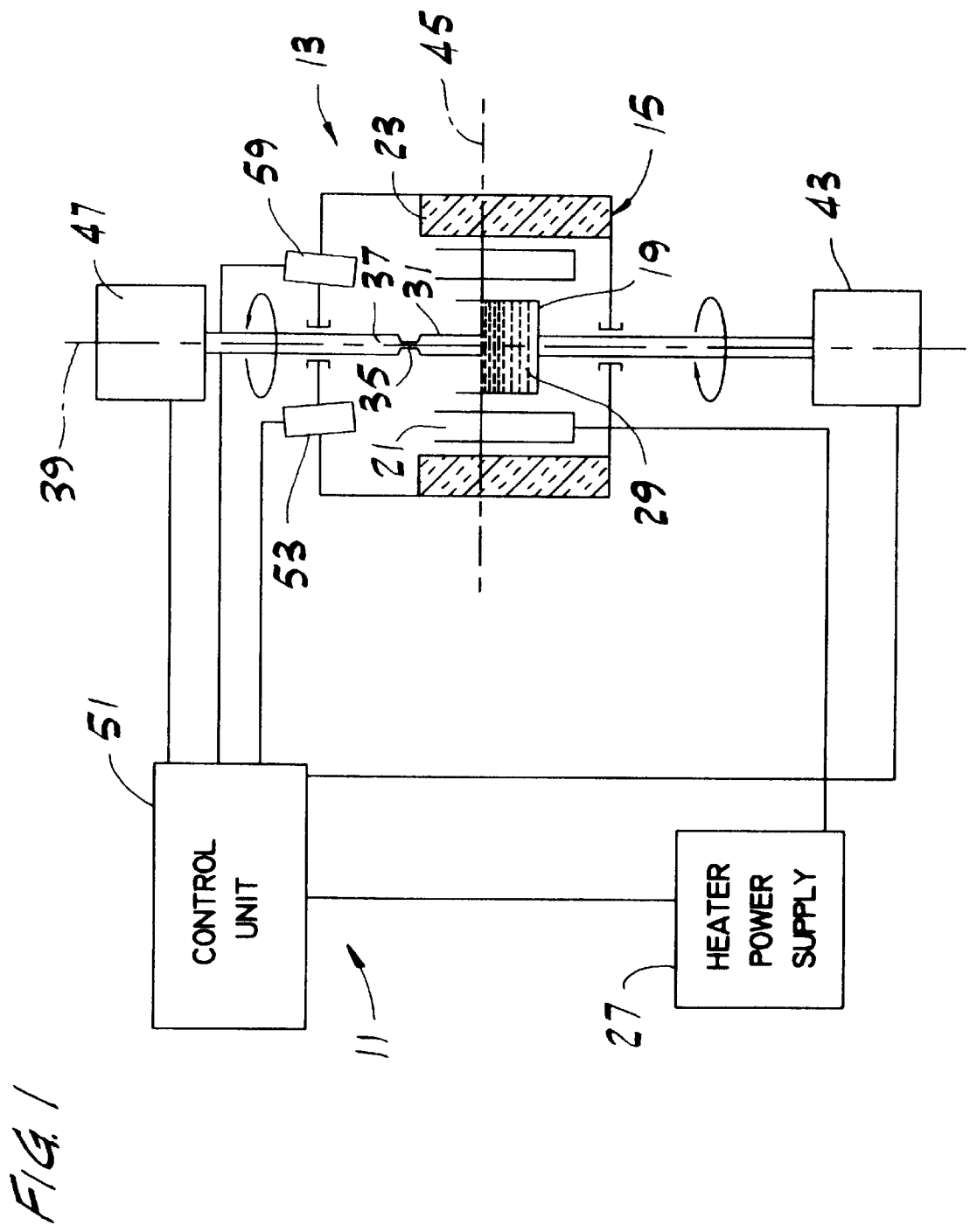
FIG. 1 is an illustration of a crystal growing apparatus and a system for controlling the crystal growing apparatus according to a preferred embodiment of the invention.

Referring now to FIG. 1, a system 11 is shown for use with a Czochralski crystal growing apparatus 13. According to the invention, the system 11 determines a plurality of parameters for controlling the crystal growth process. In the illustrated embodiment, the crystal growing apparatus 13 includes a vacuum chamber 15 enclosing a crucible 19. Heating means such as a resistance heater 21 surrounds the crucible 19. In one embodiment, insulation 23 lines the inner wall of vacuum chamber 15 and a chamber cooling jacket (not shown) fed with water surrounds it. A vacuum pump (not shown) typically removes gas from within the vacuum chamber 15 as an inert atmosphere of argon gas is fed into it.

According to the Czochralski single crystal growth process, a quantity of polycrystalline silicon, or polysilicon, is charged to crucible 19. A heater power supply 27 provides electric current through the resistance heater 21 to melt the charge and, thus, form a silicon melt 29 from which a single crystal 31 is pulled. As is known in the art, the single crystal 31 starts with a seed crystal 35 attached to a pull shaft, or cable, 37. As shown in FIG. 1, single crystal 31 and crucible 19 generally have a common axis of symmetry 39.

During both heating and crystal pulling, a crucible drive unit 43 rotates crucible 19 (e.g., in the clockwise direction). The crucible drive unit 43 also raises and lowers crucible 19 as desired during the growth process. For example, crucible drive unit 43 raises crucible 19 as the melt 29 is depleted to maintain its level, indicated by reference character 45, at a desired height. A crystal drive unit 47 similarly rotates the cable 37 in a direction opposite the direction in which crucible drive unit 43 rotates crucible 19. In addition, the crystal drive unit 47 raises and lowers crystal 31 relative to the melt level 45 as desired during the growth process.

In one embodiment, crystal growth apparatus 13 preheats the seed crystal 35 by lowering it nearly into contact with the molten silicon of melt 29 contained by crucible 19. After preheating, crystal drive unit 47 continues to lower seed crystal 35 via cable 37 into contact with melt 29 at its melt level 45. As seed crystal 35 melts, crystal drive unit 47 slowly withdraws, or pulls, it from the melt 29. Seed crystal 35 draws silicon from melt 29 to produce a growth of silicon single crystal 31 as it is withdrawn. Crystal drive unit 47 rotates crystal 31 at a reference rate as it pulls crystal 31 from melt 29. Crucible drive unit 43 similarly rotates crucible 19 at another reference rate, but usually in the opposite direction relative to crystal 31.

A control unit 51 initially controls the withdrawal rate and the power that power supply 27 provides to heater 21 to cause a neck down of crystal 31. Preferably, crystal growth apparatus 13 grows the crystal neck at a substantially constant diameter as seed crystal 35 is drawn from melt 29. For example, the control unit 51 maintains a substantially constant neck diameter of about fifteen percent of the desired diameter. After the neck reaches a desired length, control unit 51 then adjusts the rotation, pull and/or heating parameters to cause the diameter of crystal 31 to increase in a cone-shaped manner until a desired crystal body diameter is reached. Once the desired crystal diameter is reached, control unit 51 controls the growth parameters to maintain a relatively constant diameter as measured by system 11 until the process approaches its end. At that point, the pull rate and heating are usually increased for decreasing the diameter to form a tapered portion at the end of single crystal 31. Commonly assigned U.S. Pat. No. 5,178,720, the entire disclosure of which is incorporated herein by reference, discloses one preferred method for controlling crystal and crucible rotation rates as a function of the crystal diameter.

Preferably, control unit 51 operates in combination with at least one two-dimensional camera 53 to determine a plurality of parameters of the growth process including melt level 45. For example, the camera 53 is a monochrome charge coupled device (CCD) array camera, such as a SONY® XC-75 CCD video camera having a resolution of 768×494 pixels. Another suitable camera is a JAVELIN® SMART-CAM JE camera. Camera 53 is mounted above a viewport (not shown) of chamber 15 and aimed generally at the intersection of longitudinal axis 39 and melt level 45 (see FIG. 3). For example, the operator of crystal growing apparatus 13 positions camera 53 at an angle of approximately 34° with respect to the substantially vertical axis 39.

In one preferred embodiment, camera 53 is equipped with a lens (e.g., 16 mm) providing a relatively wide field of view (e.g., approximately 300 mm or more). This allows camera 53 to generate video images of a relatively wide portion of the interior of crucible 19 during the growth process of crystal 31. The images generated by camera 53 preferably include a portion of a meniscus 101 (see FIG. 3) at the interface between melt 29 and crystal 31. Melt 29 and crystal 31 are essentially self-illuminating and provide light for camera 53 without the use of an external light source. It is to be understood that additional cameras may also be used to provide differing fields of view.

In addition to processing signals from camera 53, control unit 51 processes signals from other sensors. For example, a temperature sensor 59, such as a photo cell, may be used to measure the melt surface temperature.

Figure 2:
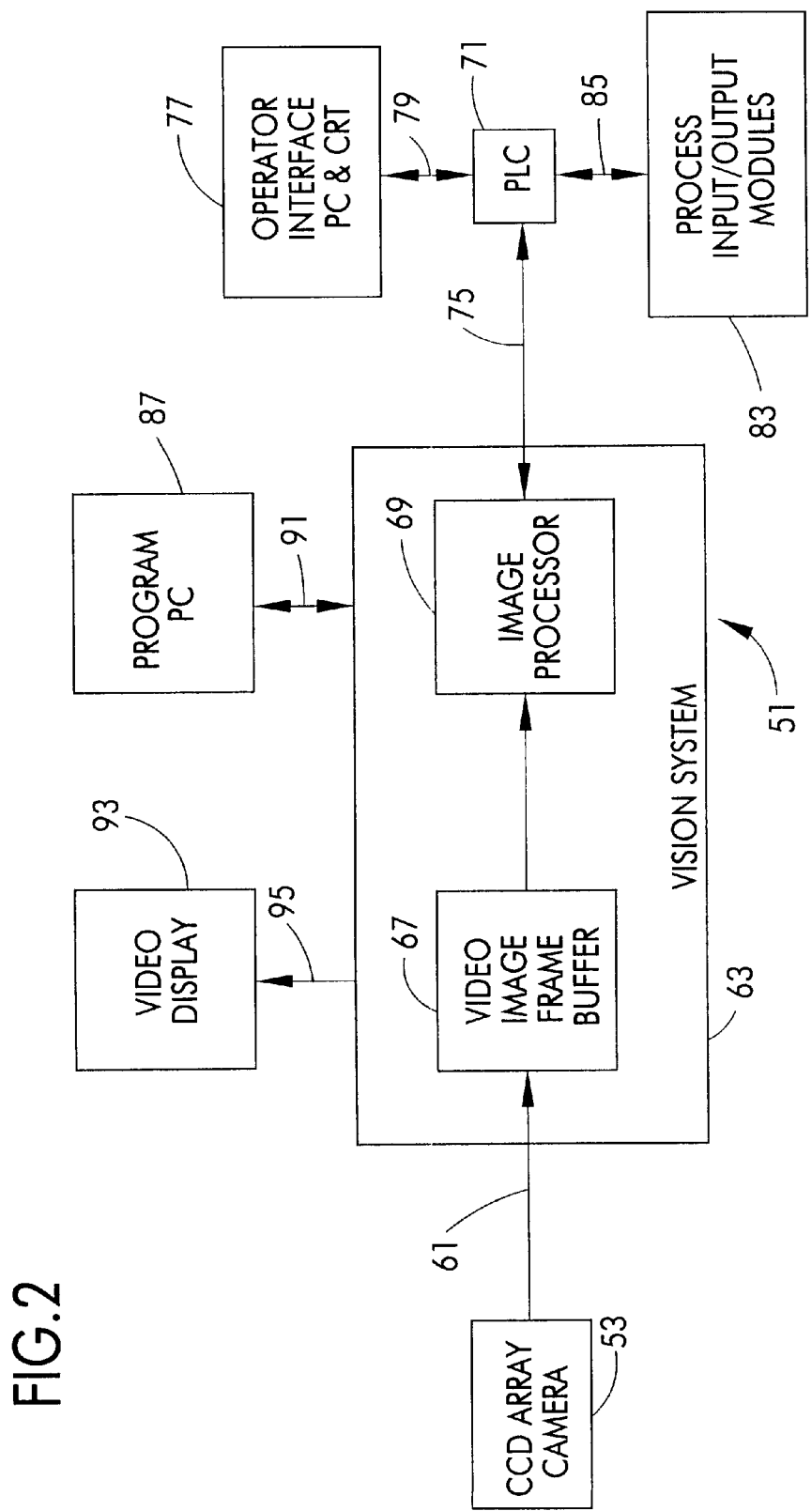
FIG. 2 is a block diagram of a control unit of the system of FIG. 1.

FIG. 2 illustrates a preferred embodiment of control unit 51 in block diagram form. Camera 53 communicates video images of the interior of crucible 19 via line 61 (e.g., RS-170 video cable) to a vision system 63 providing edge detection and measurement calculations. As shown in FIG. 2, the vision system 63 includes a video image frame buffer 67 and an image processor 69 for capturing and processing the video image. In turn, vision system 63 communicates with a programmable logic controller (PLC) 71 via line 75. As an example, vision system 63 is a CX-100 IMAGENATION Frame Grabber or a COGNEX® CVS-4400 vision system. In one preferred embodiment, the PLC 71 is a Model 575 PLC or a Model 545 PLC manufactured by TEXAS INSTRUMENTS® and line 75 represents a communications interface (e.g., VME backplane interface). Depending on the particular controller embodying PLC 71, the communications interface 75 may be, for example, a custom VME rack which includes an additional communications board (e.g., Model 2571 Program Port Expander Module using the RS-422 serial bidirectional PLC port). In this manner, image processor 69 of vision system 63 communicates melt level values, timing signals, control signals and the like to PLC 71 via VME bus 75.

The control unit 51 also includes a programmed digital or analog computer 77 for use in controlling, among other things, crucible drive unit 43, single crystal drive unit 47 and heater power supply 27 as a function of processed signals from camera 53. As shown in FIG. 2, PLC 71 communicates with the computer 77 via line 79 (e.g., RS-232 cable) and with one or more process input/output modules 83 via line 85 (e.g., RS-485 cable). According to the invention, computer 77 provides an operator interface which permits the operator of crystal growing apparatus 13 to input a set of desired parameters for the particular crystal being grown.

In one embodiment, vision system 63 also communicates with a personal computer 87 via line 91 (e.g., RS-232 cable) as well as a video display 93 via line 95 (e.g., RS-170 RGB video cable). The video display 93 displays the video image generated by camera 53 and the computer 87 is used to program vision system 63. In the alternative, computers 77, 87 may be embodied by a single computer for programming the crystal growth process automation and providing an operator interface. Further, it is to be understood that vision system 63 as embodied by certain systems may include its own computer (not shown) or may be used in combination with the personal computer 77 for processing the captured images.

The process input/output module 83 provides a path to and from crystal growing apparatus 13 for controlling the growth process. As an example, PLC 71 receives information regarding the melt temperature from temperature sensor 59 and outputs a control signal to heater power supply 27 via process input/output module 83 for controlling the melt temperature thereby controlling the growth process.

Figure 3:
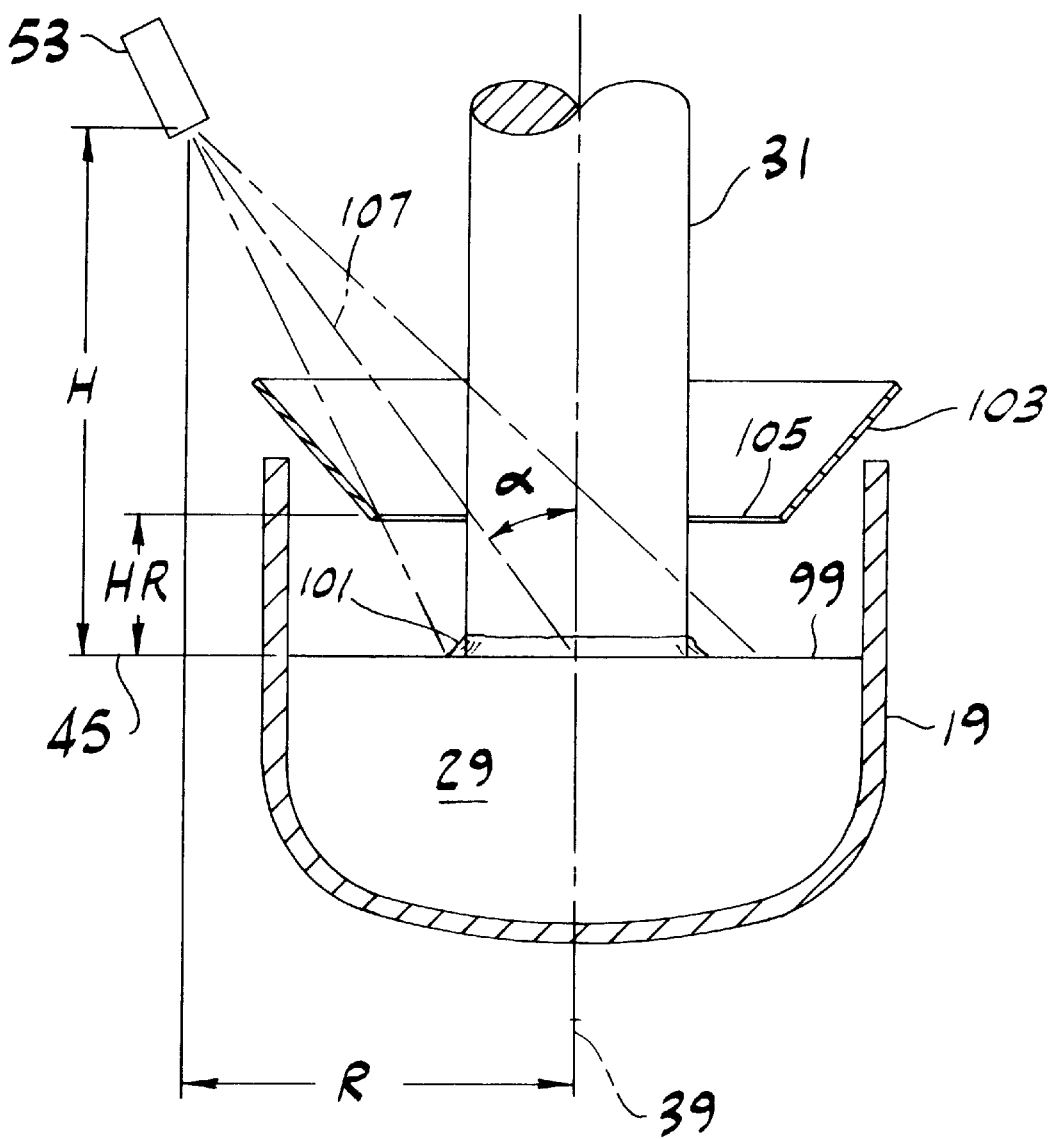
FIG. 3 is a schematic, fragmentary cross section of the crystal growing apparatus of FIG. 1 showing a silicon crystal being pulled from a melt contained in the crystal growing apparatus and a reflector assembly as it is positioned during growth of a silicon crystal.

FIG. 3 illustrates a later phase of the crystal growth process following melt-down and dipping of seed crystal 35. As shown, crystal 31 constitutes a generally cylindrical body of crystalline silicon (i.e., an ingot). It should be understood that an as-grown crystal, such as crystal 31, typically will not have a uniform diameter, although it is generally cylindrical. For this reason, its diameter may vary slightly at different axial positions along axis 39. Further, the diameter of crystal 31 will vary in the different phases of crystal growth (e.g., seed, neck, crown, shoulder, body and end cone). A surface 99 of melt 29 has a liquid meniscus 101 formed at the interface between crystal 31 and melt 29. As is known in the art, the reflection of crucible 19 on the meniscus 101 is often visible as a bright ring adjacent crystal 31.

FIG. 3 also illustrates an exemplary reflector assembly 103 positioned within crystal growing apparatus 13 during growth of silicon crystal 31. As is known in the art, hot zone apparatus, such as the reflector assembly 103, is often disposed within crucible 19 for thermal and/or gas flow management purposes. For example, reflector 103 is, in general, a heat shield adapted to retain heat underneath itself and above melt 29. Those skilled in the art are familiar with various reflector designs and materials (e.g., graphite and gray quartz). As shown in FIG. 3, reflector assembly 103 has an inner surface 105 that defines a central opening through which crystal 31 is pulled. According to the invention, system 11 provides melt level measurement and control based on the known dimensions of the opening in reflector 103 and based on measurements of a reflection, or virtual image, 103' of the reflector 103 on the surface 99 of melt 29. As will be described in detail below, system 11 advantageously calculates both the height of reflector 103 and the melt level 45 in addition to determining a gap measurement HR between the two.

The camera 53 is mounted in a viewport of chamber 15 and aimed generally at the intersection between axis 39 and the surface 99 of melt 29. Aimed in this manner, an optical axis 107 of camera 53 is at an acute angle $\alpha$ (e.g., $\alpha \approx 15-35°$) with respect to axis 39 and, thus, camera 53 provides a view of a vertical region that includes the full diameters of both reflector 103 and its reflection 103' on the melt surface 99. The lens of camera 53 preferably provides a horizontal field of view that encompasses the fall diameter of the opening in reflector 103 (i.e., the width of inner reflector surface 105). Variability may result due primarily to changes in the distance between camera 53 and reflector 103 affecting the magnification of the optics. For example, increasing the distance from camera 53 to reflector 103 causes it to appear smaller. Further, the distance from camera 53 to melt 29 affects the appearance of reflection 103'. Camera 53 is preferably calibrated so that the focal length and image size are accurately known. As shown in FIG. 3, a height H and a radius R define the position of camera 53 and a height HR defines the position of reflector 103. In the illustrated embodiment, both heights H and HR are measured relative to melt level 45.

When instructed by PLC 71 to start inspection, the frame buffer 67 of vision system 63 acquires images of the interior of crucible 19 generated by camera 53 at regular intervals (e.g., every one second). The images of the interior of crucible 19 captured by frame buffer 67 each comprise a plurality of pixels. As is known in the art, each pixel has a value representative of an optical characteristic of the image. For example, the pixel values, or gray levels, correspond to the intensity of the pixels. In a preferred embodiment of the invention, image processor 69 defines at least two regions or areas of interest indicated by reference character 109 in FIG. 4. These regions 109 are also referred to as windows. In this embodiment, image processor 69 examines the pixels within regions 109 for an optical characteristic of the image (e.g., the intensity or gradient of the intensity of the pixels). Particularly, image processor 69 implements two edge tools 111 (see FIG. 5) within each region 109 for detecting edges in the image based on the detected characteristic. In the vision system arts, edges are defined as regions in the image where there is a relatively large change in gray level over a relatively small spatial region. It is to be understood that in addition to or instead of intensity or intensity gradient, other optical characteristics of the image, such as color or contrast, may be detected for finding edge coordinates.

Figure 4:
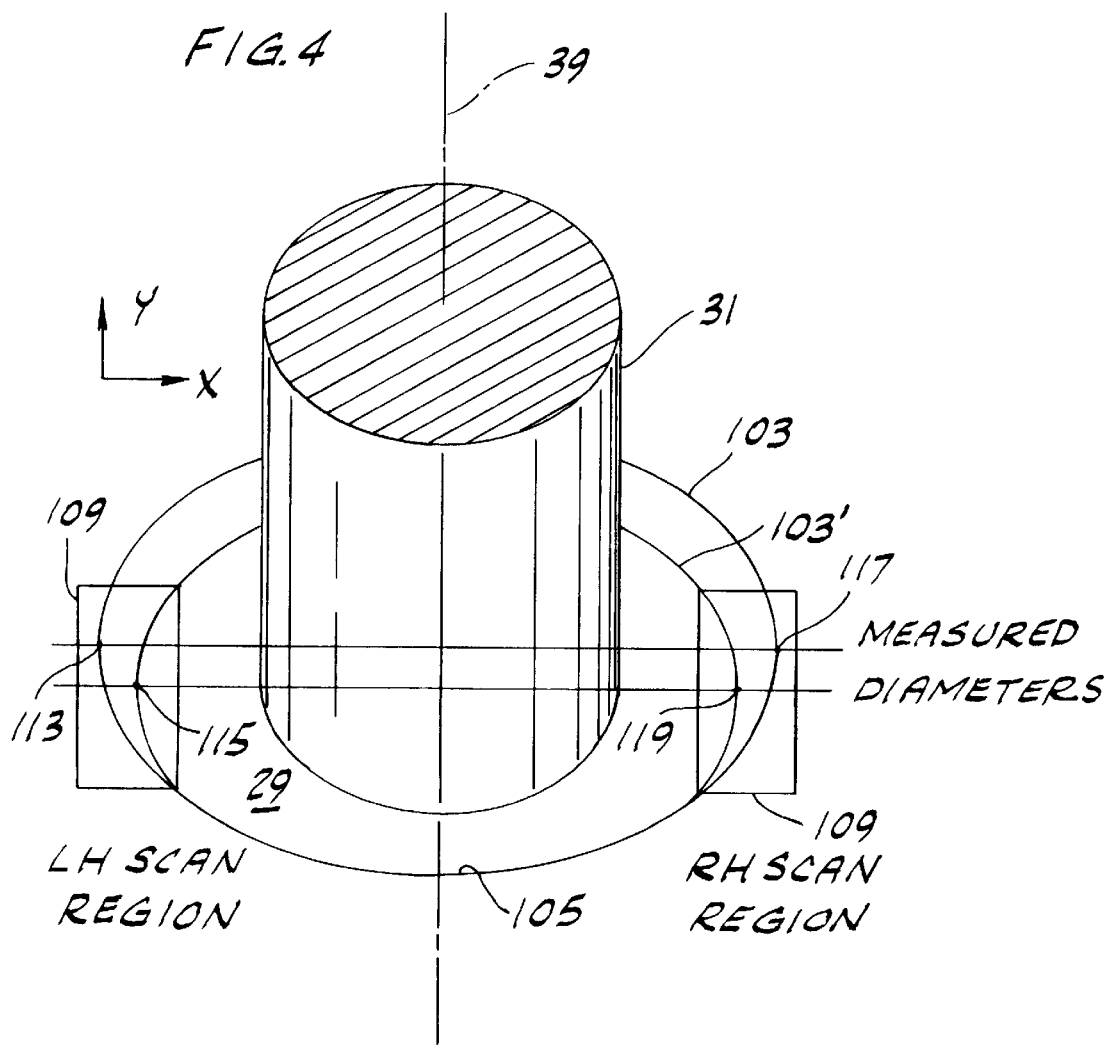
FIG. 4 is a fragmentary perspective view of the crystal growing apparatus of FIG. 3 showing image processing regions relative to the crystal being pulled from the melt.

As shown in FIG. 4, system 11 examines the pixels within the regions 109 to detect a left-hand edge 113 of reflector 103, a left-hand edge 115 of reflection 103', a right-hand edge 117 of reflector 103 and a right-hand edge 119 of reflection 103'. In this instance, the distance across the image between the left-hand edge 113 and the right-hand edge 117 provides a diameter measurement of the central opening in reflector 103. Likewise, the distance across the image between the left-hand edge 115 and the right-hand edge 119 provides a diameter measurement of reflection 103'.

Image processor 69 preferably defines regions 109 at preselected positions in the images generally corresponding to positions at which the image is expected to include reflector 103 and its reflection 103'. In other words, image processor 69 defines regions 109 with respect to a defined center line (i.e., axis 39). By defining regions 109 at preselected positions, image processor 69 avoids known or expected reflections, hot zone apparatus and the like that might cause spurious measurements. In one preferred embodiment, the regions of interest 109 are programmable rectangular regions, the size and location of which exclude unwanted images. Image processor 69 dynamically moves the edge tools 111 within the regions 109 to find edges of the stationary reflector 103 and variable reflection 103'. In this manner, image processor 69 determines edge coordinates along the inner surface 105 of reflector 103, as well as edge coordinates along the corresponding reflection 103', for processing as described below.

Figure 5:
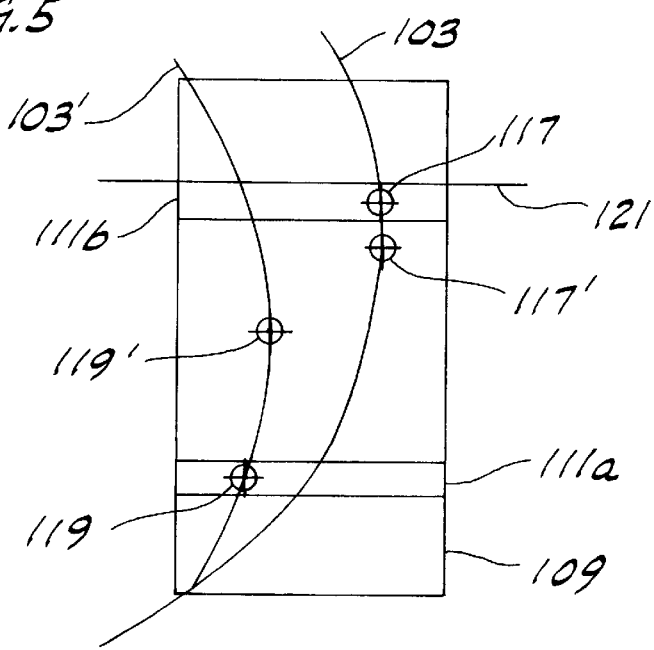
FIG. 5 is an enlarged view of one of the image processing regions of FIG. 4.

FIG. 5 is an enlarged view of an exemplary right-hand region of interest 109 including edge tools 111. It is to be understood that edge detection within the left-hand region 109 occurs in a manner similar to the corresponding right-hand region 109. In one embodiment of the invention, the edges in the image are defined with respect to an (x,y) coordinate system having its origin in the bottom, left-hand corner of the image. Vision system 63 executes software to place and move the four edge detection tools 111 vertically within regions 109 to detect minimum "x-position" values of the left-hand edges 113, 115 and to detect the maximum "x-position" values of the right-hand edges 117, 119. The minimum "x-position" values for both the reflector 103 and its reflection 103' are subtracted from the maximum "x-position" values to determine the respective diameters in pixel counts. In some circumstances (e.g., very low melt levels), however, reflector 103 may block the full diameter of reflection 103'. If this occurs, image processor 69 calculates the diameter using well-known formulas for circular objects involving "y-positions" as well as "x-positions".

According to a preferred scanning technique, each region of interest 109 includes two edge detection tools 111 (also referred to as scan regions). In the illustrated embodiment, a lower (inside) edge tool 111a scans a predetermined lower portion of region 109 and an upper (outside) edge tool 111b scans a predetermined upper portion of region 109 to detect the edges of reflector 103 and its reflection 103' within the region of interest 109. As an example, the lower edge tool 111a scans 62% of region 109 beginning at the bottom and moving upwardly and the upper edge tool 111b scans 38% of region 109 beginning at the top and moving downwardly. FIG. 5 also illustrates an exemplary horizontal reference line 121 about which the upper edge tool 111b is centered. In this embodiment, an operator can program an offset parameter that defines the vertical sizes of the edge tools 111 as a function of the height of region 109. The offset parameter also causes the region 109 to move up or down such that the upper scan region 111b is vertically centered about the horizontal reference line 121. For example, an offset of 62 causes lower scan region 111a to occupy 62% of region 109 and causes upper scan region 111b to occupy 38% of region 109, with 19% of the area of interest being positioned above horizontal reference line 121.

Beginning at the bottom of region 109, lower edge tool 111a preferably scans horizontally from the inner side of region 109 with respect to central axis 39 toward the outer side. In other words, lower edge tool 111a scans from left to right to detect the right-hand edge 119 of reflection 103'. Image processor 69 then moves lower edge tool 111a vertically upward. Conversely, upper edge tool 111b begins at the top of region 109 and horizontally scans from the outer side of region 109 with respect to central axis 39 toward the inner side. Thus, upper edge tool 111b scans from right to left to detect the right-hand edge 117 of reflector 103. Image processor 69 then moves upper edge tool 111b vertically downward. Preferably, image processor 69 uses edge tools 111 to scan from side-to-side of region 109 at a rate of about 3 scans/second.

According to one embodiment of the invention, the edge tools 111 of image processor 69 detect one or more edges within the regions 109. For example, several of the side-to-side scans by edge tool 111a could detect an edge of reflection 103' as the image processor 69 moves the edge tool 111a upwardly within region 109. Preferably, image processor 69 selects the maximum "x-position" values of the edges detected in the right-hand region 109 by edge tools 111a, 111b for use in measuring the diameters of reflector 103 and its reflection 103'. Further, image processor 69 saves the previous maximum "x-position" value of the detected edges. In FIG. 5, reference character 117' indicates a previous rightmost edge of reflector 103 and reference character 119' indicates a previous rightmost edge of reflection 103'. In a similar manner, the minimum "x-position" values of the edges detected in the left-hand region 109 are also selected for use in measuring the diameters.

Figure 6:
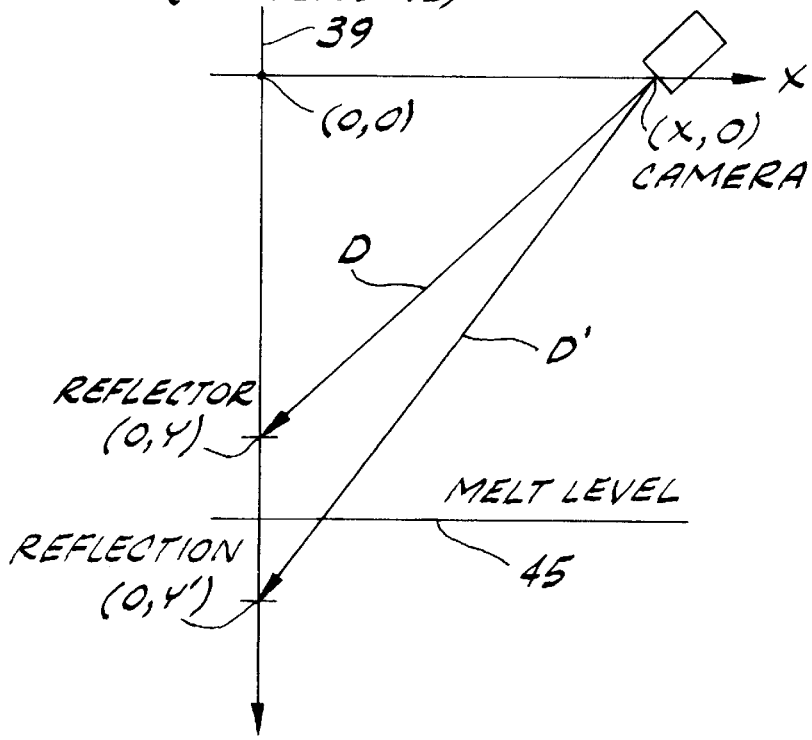
FIG. 6 schematically represents the relationship between the reflector assembly of FIGS. 3–5 and a camera for generating an image of the interior of the crystal growing apparatus.

Referring now to FIG. 6, system 11 provides melt level measurement and control based on the known dimensions of the opening in reflector 103 and based on the measured dimensions of the reflector 103 and its reflection, or virtual image, 103'. In the case of a plane mirror, for example, a virtual image is the same size as the object and is located the same distance "behind" the mirror as the object is in front of the mirror. System 11 uses the pixel count for the diameter of reflector 103 and the pixel count for the diameter of reflection 103', along with the known diameter of reflector 103 and the calibration information for camera 53, to calculate a distance D from camera 53 to reflector 103 and a distance D' from camera 53 to reflection 103', i.e., the virtual image of reflector 103. In one embodiment, PLC 71 multiplies the known diameter of the central opening in reflector 103 (in millimeters) by a calibration factor (in pixels) and divides the product by the measured diameter (in pixels) of reflector 103 and reflection 103' to obtain the distances D and D', respectively. The operator determines the calibration factor during set up based on the specifications of camera 53. For example, the lens of camera 53 has a focal length of 12.5 mm and the image plane of camera 53 measures $9.804 \times 10^{-3}$ mm/pixel. According to the invention, PLC 71 uses a calibration factor of $12.5/(9.804 \times 10^{-3})$ pixels. In this example, reflector 103 typically has a known diameter of a few hundred millimeters depending on, among other factors, the size of crystal 31 being grown.

In one preferred embodiment, the program executed by PLC 71 adjusts the diameter measurement of reflection 103' prior to determining the distance D' to account for the fact that surface 99 is not exactly planar (due to rotation of crucible 19, surface 99 tends to be dish-shaped). Consequently, the difference in image sizes is a function of the distances D it and D' to camera 53.

In FIG. 6, system 11 calculates the "y-positions" of reflector 103 and reflection 103' based on the distances D and D', respectively. In this instance, system 11 defines an (x,y) coordinate system with its origin on the central axis 39 at the height of camera 53. System 11 also calculates the distance X of camera 53 from the centerline of the puller (i.e., axis 39). Preferably, an operator obtains the value X from the mechanical specifications of crystal growing apparatus 13 and the mounting information of camera 53. In this instance, x=X=R. Using these dimensions, system 11 determines:

$$\text{Reflector Position:} Y = \sqrt{D^2 - X^2}$$

$$\text{Virtual Image:} Y' = \sqrt{D'^2 - X^2}$$

$$\text{Melt Level:} ML = \frac{Y + Y'}{2}$$

$$\text{Reflector Height:} HR = \frac{Y' - Y}{2}$$

For purposes of this application, melt level 45 is defined as the vertical distance from camera 53 to surface 99 of melt 29. Since the vertical distance from camera 53 to the top of heater 21 is fixed, melt level 45 may also be determined relative to heater 21 based on this calculation.

In operation, image processor 69 defines regions 109 at the left-hand and right-hand sides of the image and detects an intensity gradient characteristic of the image within edge tools 111. Control unit 51 preferably determines a melt level parameter ML and a reflector height parameter HR based on detected edges for use in controlling the crystal growth process. Thus, image processor 69 constitutes a detection circuit, a defining circuit and a measurement circuit and PLC 71 constitutes a control circuit.

FIG. 7 illustrates an exemplary initialization routine 123 for system 11. Beginning at step 125, the initialization routine 123 calls for inputting known data to PLC 71. In this instance, the known data includes the diameter of reflector 103, the lens focal length and image plane size of camera 53 (for calibration purposes) and the distance X. The distance X, also referred to as R, represents the distance from camera 53 to central axis 39 (i.e., pulling cable 37). In one preferred crystal growing apparatus 13, camera 53 is located about 400 mm from central axis 39. In some instances, the operator also inputs the vertical thickness of the reflector 103 to be subtracted from the raw reflector height measurement. For example, a gray quartz reflector is about 4 mm thick and a graphite reflector is about 33 mm thick.

At step 127, an operator aligns camera 53 so that its view includes the hot zone features of interest (e.g., both reflector 103 and its reflection 103' on the surface 99 of melt 29). Typically, the viewport of crystal growing apparatus 13 includes a filter, such as a gold infrared filter. The operator positions the lens of camera 53 within a few millimeters (e.g., 2–5 mm) of the filter at step 127. The operator also positions camera 53 with respect to bottom and top of the viewport. For example, the bottom edge of the lens is about 40–45 mm from the bottom edge of the filter on the viewport. Otherwise, camera 53 may be too high in the viewport and, thus, too close to the central axis 39. This causes the viewport itself to block the view of the reflector 103. Conversely, if camera 53 is positioned too low in the viewport and, thus, to far from central axis 39, the top of reflector 103 will block the view of crystal 31 at full diameter. Preferably, the operator centers camera 53 with respect to the left and right sides of the viewport.

As part of step 131, the operator performs a final camera and vision tool alignment. In particular, the operator programs the size and position of regions 109 to reduce the number of unwanted edges that are detected by the edge tools 111. For example, the operator sets the height of each region of interest 109 as a function of the vertical image size. Preferably, the operator sets the height to include the edge of reflector 103 at its full diameter near the top of region 109 and to include all of reflection 103' until it is hidden from view by reflector 103 near the bottom of region 109. Likewise, the operator sets the width of each region 109 as a function of the horizontal image size to include the edge of reflector 103 near the outer side of region 109 and to include enough of reflection 103' to provide an edge "target" for an inside edge tool scan. The operator may further adjust the position of camera 53 for "fine tuning" to exclude any edges caused by the viewport. At step 131, the operator also ensures that there is sufficient scanning areas for both outside and inside (upper and lower, respectively) edge tools 111. Since the outside edge tools 111 are scanning a fixed target (i.e., an edge of reflector 103), their areas can be much smaller (e.g., 38% of the size of region 109) than the inside edge tools 111 that are scanning for a potentially moving target, i.e., an edge of reflection 103', which will move due to changes in melt level 45.

At step 133, the operator defines edge detection threshold values for edge tools 111 to detect the reflector 103. Similarly, the operator adjusts the edge detection threshold values at step 135 to detect reflection 103'. The edge strength threshold parameter controls which edges are detected and which are ignored. Edge tools 111 measure variations in light intensity and calculate "scores" for these variations along the lengths of their windows. If a score is greater than the threshold, tool 111 reports an edge found at that location. In one embodiment, the edge tools 111 are set up to report the first edge to PLC 71. If detecting crystal meniscus 101, for example, other edge detection tools may be set up to report the strongest and best edge. The edge tools 111 are directional, measuring inwardly for the outside edges and measuring outwardly for the inside edges. For example, the operator sets an outer edge strength threshold to ensure that the outside edge tools 111 are correctly finding the top edge of reflector 103. Since the outside edge tools 111 are looking inwardly, toward the center of the image, this value may need to be increased if edges are being found too soon (outside of reflector 103) or decreased if the correct edges are being missed. Likewise, the operator sets an inner edge strength threshold to ensure that the inside edge tools 111 are correctly finding the reflection 103'. Since the inside edge tools are looking outwardly, away from the center of the image, this value may need to be increased if edges are being found too soon (inside of reflection 103') or decreased if the correct edges are being missed. It is to be understood that the threshold values may differ for different types of reflectors made from different materials.

Referring now to FIGS. 8A and 8B, system 11, including control unit 51, operates according to a flow diagram 141 following initialization for providing closed loop control of crystal growing apparatus 13. Beginning at step 143, camera 53 generates images of the interior of crucible 19 including reflector 103 and its reflection 103'. The frame buffer 67 of vision system 63 captures the images from the video image signal of camera 53 at step 145 for processing by the image processor 69.

Vision system 63 begins edge detection within regions 109 at step 149. Image processor 69, operating in conjunction with PLC 71, processes the images as a function of the pixel values to detect edges in the images. Preferably, processor 69 performs several routines for analyzing the image, including edge detection routines for analyzing the gray level changes (as a function of image intensity) in a defined region of the image. Various edge detection operators, or algorithms, for finding and counting edges in an image are known to those skilled in the art. For example, suitable edge detection routines include Canny or Hough algorithms. It is to be understood that in addition to intensity, other characteristics of the image, such as intensity gradient, color or contrast, may be used to optically distinguish meniscus 101 or other objects on the surface 99 of melt 29 from melt 29 itself.

At step 149, image processor 69 scans inwardly with the upper edge tool 111 of left-hand region 109 to detect an edge of reflector 103. If image processor 69 determines at step 151 that an edge was not detected, it reports a detected edge adjacent the left-hand boundary of the image at step 153. In other words, if the image is 640 pixels wide, image processor 69 reports an edge at pixel #1. This allows PLC 71 to recognize that the scan did not detect a valid edge. Similarly, image processor 69 scans outwardly at step 157 with the lower edge tool 111 of left-hand region 109 to detect an edge of reflection 103'. If image processor 69 determines at step 159 that an edge was not detected, it reports a detected edge adjacent the right-hand boundary of the image at step 161. In this instance, image processor 69 reports an edge at pixel #639 to allow PLC 71 to recognize that the scan did not detect a valid edge.

Proceeding to step 165 for processing the right-hand region 109, image processor 69 scans outwardly with the lower edge tool 111 of right-hand region 109 to detect an edge of reflection 103'. If image processor 69 determines at step 167 that an edge was not detected, it reports a detected edge adjacent the left-hand boundary of the image at step 169. In other words, image processor 69 reports an invalid edge at pixel #1. Similarly, image processor 69 scans inwardly at step 173 with the upper edge tool 111 of right-hand region 109 to detect an edge of reflector 103. If image processor 69 determines at step 175 that an edge was not detected, it reports a detected edge adjacent the right-hand boundary of the image at step 177. In this instance, image processor 69 reports an invalid edge at pixel #639. If image processor 69 completes scanning the regions 109 at step 179, it proceeds to step 181 of FIG. 8B. On the other hand, if edge tools 111 are not at the end of the respective scan region 109, image processor returns to the scanning routine beginning at step 149.

Based on the detected edges, image processor 69 selects the maximum and minimum "x-position" values for use in measuring the diameters of reflector 103 and its reflection 103' in pixel counts. At step 181, image processor 69 determines the diameter of reflector 103 based on the difference between the rightmost edge detected at step 173 and the leftmost edge detected at step 149. In a similar manner, image processor 69 determines at step 183 the diameter of reflection 103' based on the difference between the rightmost edge detected at step 165 and the leftmost edge detected at step 157. Image processor 69 then proceeds to step 185 for reporting the measured diameters to the PLC 71 of control unit 51 via VME bus 75.

At step 189, PLC 71 receives the measured diameter of reflection 103' and adjusts its to provide a degree of compensation for the effect of crucible rotation on the melt surface 99. As described above, rotation of crucible 19 causes surface 99 to be "dish-shaped" rather than exactly planar. In a preferred embodiment, PLC 71 compensates for the crucible rotation effect by multiplying the measured diameter of reflection 103' by a compensation factor CF:

$$\text{Compensation Factor: } CF = (1 - 0.00012 \times RPM^2)$$

Those skilled in the art will recognize that the compensation factor may be determined by other means. For example, Faber, *Fluid Dynamic for Physicists,* 1995, page 42, incorporated herein by reference, teaches of the effect that a rotating vessel has on the surface of a liquid in the vessel and provides equations from which a compensation factor can be mathematically derived.

Proceeding to step 191, PLC 71 uses the measured diameter of reflector 103 and the corrected diameter of reflection 103' to calculate a number of parameters. In this embodiment of the invention, PLC 71 calculates the distance D from camera 53 to reflector 103 and the distance D' from camera 53 to the corresponding virtual image (i.e., reflection 103'). Based on these calculations, PLC 71 determines the vertical position Y of reflector 103 and the vertical position Y' of the corresponding virtual image (i.e., reflection 103'). Ultimately, PLC 71 calculates the reflector height parameter HR and the melt level parameter ML (also referred to as height H in FIG. 3). Control unit 51 then executes programs in response to these determined parameters for controlling crystal growing apparatus 13. In a preferred embodiment, the PLC 71 of control unit 51 is responsive to the determined melt level, reflector level and melt gap for controlling the crystal growth process. In particular, PLC 71 is responsive to the determination of these parameters for controlling the level of crucible 19, the temperature of heater 21, the rotational speeds and/or pull rates thereby to control crystal growth apparatus 13. As such, closed loop control is performed.

In view of the above, it will be seen that the several objects of the invention are achieved and other advantageous results attained.

As various changes could be made in the above constructions and methods without departing from the scope of the invention, it is intended that all matter contained in the above description or shown in the accompanying drawings shall be interpreted as illustrative and not in a limiting sense.

What is claimed is:

1. A method for use in combination with an apparatus for growing a silicon single crystal, said crystal growing apparatus having a heated crucible containing a silicon melt from which the single crystal is pulled, said crystal growth apparatus also having a reflector positioned within the crucible above the melt, said reflector having an inner surface defining a central opening through which the crystal is pulled, said melt having a top surface on which a reflection of the reflector is visible, said crystal being pulled generally along a central axis that is substantially perpendicular to the top surface of the melt, said method comprising the steps of:

generating images of a portion of the reflector and a portion of the reflection of the reflector on the top surface of the melt with a camera, said images each including a plurality of pixels, said pixels each having a value representative of an optical characteristic of the image;

processing the images as a function of the pixel values to detect at least two edges of the reflector and at least two edges of the reflection in the images, said edges of the reflection corresponding to a virtual image of the reflector;

measuring the distance between the detected edges of the reflector to determine a dimension of the reflector in pixels and measuring the distance between the detected edges of the reflection to determine a dimension of the virtual image of the reflector in pixels;

determining a distance from the camera to the reflector and a distance from the camera to the virtual image of the reflector based on the relative positions of the detected edges in the images;

determining at least one parameter representative of a condition of the crystal growing apparatus based on the determined distances; and controlling the crystal growing apparatus in response to the determined parameter.

2. The method of claim 1 wherein the central opening in the reflector has a predetermined diameter and further comprising the step of converting the determined dimensions of the reflector and its virtual image to the distance from the camera to the reflector and the distance from the camera to the virtual image, respectively, as a function of the diameter of the central opening in the reflector and a camera calibration factor.

3. The method of claim 1 wherein the parameter determining step comprises determining a melt level parameter representative of the level of the top surface of the melt relative to a reference.

4. The method of claim 1 wherein the parameter determining step comprises determining a reflector position parameter representative of the position of the reflector relative to a reference.

5. The method of claim 1 wherein the parameter determining step comprises determining a reflector height parameter representative of the position of the reflector relative to the top surface of the melt.

6. The method of claim 1 wherein the central opening in the reflector has a predetermined diameter and further comprising the step of defining a plurality of window regions of the image at positions located radially with respect to the central axis and at a distance therefrom of approximately half the diameter of the central opening.

7. The method of claim 1 wherein the crystal growing apparatus provides for relative movement between the crystal and the crucible and wherein the controlling step comprises controlling the relative movement between the crystal and the crucible in response to the determined parameter thereby to control the crystal growing apparatus.

8. The method of claim 7 wherein the controlling step comprises controlling the vertical position of the crucible so that the top surface of the melt is at a desired level relative to a reference.

9. The method of claim 1 wherein the controlling step comprises controlling the rate at which the crystal is pulled from the melt in response to the determined parameter thereby to control the crystal growing apparatus.

10. The method of claim 1 wherein the controlling step comprises controlling the temperature of the melt in response to the determined parameter thereby to control the crystal growing apparatus.

11. A method for use in combination with an apparatus for growing a silicon single crystal, said crystal growing apparatus having a heated crucible containing a silicon melt from which the single crystal is pulled, said crystal growth apparatus also having a reflector positioned within the crucible above the melt, said reflector having an inner surface defining a central opening through which the crystal is pulled, said melt having a top surface on which a reflection of the reflector is visible, said crystal being pulled generally along a central axis that is substantially perpendicular to the top surface of the melt, said method comprising the steps of:

generating images of a portion of the reflector and a portion of the reflection of the reflector on the top surface of the melt with a camera, said images each including a plurality of pixels, said pixels each having a value representative of an optical characteristic of the image;

processing the images as a function of the pixel values to detect an edge of the reflector and an edge of the reflection in the images, said edge of the reflection corresponding to a virtual image of the reflector;

determining a distance from the camera to the reflector and a distance from the camera to the virtual image of the reflector based on the relative positions of the detected edges in the images;

determining a melt level parameter representative of the level of the top surface of the melt relative to a reference by calculating:

$$ML = \frac{1}{2}\left(\sqrt{D^2 - X^2} + \sqrt{D'^2 - X^2}\right)$$

where ML is the melt level relative to the vertical position of the camera; D is the distance from the camera to the reflector; D' is the distance from the camera to the virtual image of the reflector; and X is the distance from the central axis to the camera; and controlling the crystal growing apparatus in response to the determined parameter.

12. A method for use in combination with an apparatus for growing a silicon single crystal, said crystal growing apparatus having a heated crucible containing a silicon melt from which the single crystal is pulled, said crystal growth apparatus also having a reflector positioned within the crucible above the melt, said reflector having an inner surface defining a central opening through which the crystal is pulled, said melt having a top surface on which a reflection of the reflector is visible, said crystal being pulled generally along a central axis that is substantially perpendicular to the top surface of the melt, said method comprising the steps of:

generating images of a portion of the reflector and a portion of the reflection of the reflector on the top surface of the melt with a camera, said images each including a plurality of pixels, said pixels each having a value representative of an optical characteristic of the image;

processing the images as a function of the pixel values to detect an edge of the reflector and an edge of the reflection in the images, said edge of the reflection corresponding to a virtual image of the reflector;

determining a distance from the camera to the reflector and a distance from the camera to the virtual image of the reflector based on the relative positions of the detected edges in the images;

determining a reflector position parameter representative of the position of the reflector relative to a reference by calculating:

$$Y = \sqrt{D^2 - X^2}$$

where Y is the reflector position relative to the vertical position of the camera; D is the distance from the camera to the reflector; and X is the distance from the central axis to the camera; and controlling the crystal growing apparatus in response to the determined parameter.

13. A method for use in combination with an apparatus for growing a silicon single crystal, said crystal growing apparatus having a heated crucible containing a silicon melt from which the single crystal is pulled, said crystal growth apparatus also having a reflector positioned within the crucible above the melt, said reflector having an inner surface defining a central opening through which the crystal is pulled said melt having a top surface on which a reflection of the reflector is visible, said crystal being pulled generally along a central axis that is substantially perpendicular to the top surface of the melt, said method comprising the steps of:

generating images of a portion of the reflector and a portion of the reflection of the reflector on the top surface of the melt with a camera, said images each including a plurality of pixels, said pixels each having a value representative of an optical characteristic of the image;

processing the images as a function of the pixel values to detect an edge of the reflector and an edge of the reflection in the images, said edge of the reflection corresponding to a virtual image of the reflector;

determining a distance from the camera to the reflector and a distance from the camera to the virtual image of the reflector based on the relative positions of the detected edges in the images;

determining a reflector height parameter representative of the position of the reflector relative to the top surface of the melt by calculating:

$$HR = \frac{1}{2}\left(\sqrt{D'^2 - X^2} - \sqrt{D^2 - X^2}\right)$$

where HR is the reflector height relative to the top surface of the melt; D is the distance from the camera to the reflector; D' is the distance from the camera to the virtual image of the reflector; and X is the distance from the central axis to the camera; and controlling the crystal growing apparatus in response to the determined parameter.

14. A method for use in combination with an apparatus for growing a silicon single crystal, said crystal growing apparatus having a heated crucible containing a silicon melt from which the single crystal is pulled said crystal growth apparatus also having a reflector positioned within the crucible above the melt, said reflector having an inner surface defining a central opening through which the crystal is pulled, said melt having a top surface on which a reflection of the reflector is visible wherein the top surface of the melt is non-planar due to rotation of the crucible during crystal growth, said crystal being pulled generally along a central axis that is substantially perpendicular to the top surface of the melt, said method comprising the steps of:

generating images of a portion of the reflector and a portion of the reflection of the reflector on the top surface of the melt with a camera, said images each including a plurality of pixels, said pixels each having a value representative of an optical characteristic of the image;

processing the images as a function of the pixel values to detect an edge of the reflector and an edge of the reflection in the images, said edge of the reflection corresponding to a virtual image of the reflector;

determining a distance from the camera to the reflector and a distance from the camera to the virtual image of the reflector based on the relative positions of the detected edges in the images;

compensating for crucible rotation in determining the distance from the camera to the virtual image of the reflector;

determining at least one parameter representative of a condition of the crystal growing apparatus based on the compensated distance; and controlling the crystal growing apparatus in response to the determined parameter.

15. The method of claim 14 wherein the compensating step comprises adjusting the determined distance from the camera to the virtual image of the reflector as a function of the speed at which the crucible is rotating.

16. A method for use in combination with an apparatus for growing a silicon single crystal, said crystal growing apparatus having a heated crucible containing a silicon melt from which the single crystal is pulled, said crystal growth apparatus also having a reflector positioned within the crucible above the melt said reflector having an inner surface defining a central opening through which the crystal is pulled, said central opening having a predetermined diameter, said melt having a top surface on which a reflection of the reflector is visible, said crystal being pulled generally along a central axis that is substantially perpendicular to the top surface of the melt, said method comprising the steps of:

generating images of a portion of the reflector and a portion of the reflection of the reflector on the top surface of the melt with a camera, said images each including a plurality of pixels, said pixels each having a value representative of an optical characteristic of the image;

defining a plurality of window regions of the image at positions located radially with respect to the central axis and at a distance therefrom of approximately half the diameter of the central opening;

processing the images as a function of the pixel values to detect an edge of the reflector and an edge of the reflection in the images said image processing step comprising defining an edge detection tool within each window region for detecting edges of the reflector and defining another edge detection tool within each window region for detecting edges of the reflection, said edge of the reflection corresponding to a virtual image of the reflector;

determining a distance from the camera to the reflector and a distance from the camera to the virtual image of the reflector based on the relative positions of the detected edges in the images;

determining at least one parameter representative of a condition of the crystal growing apparatus based on the determined distances; and controlling the crystal growing apparatus in response to the determined parameter.

17. The method of claim 16 wherein the step of defining the edge detection tools comprises moving the edge detection tools within the window regions to detect edges corresponding to a maximum width of the central opening of the reflector and a corresponding maximum width of the virtual image of the reflector.

18. A system for use in combination with an apparatus for growing a silicon single crystal, said crystal growing apparatus having a heated crucible containing a silicon melt from which the single crystal is pulled, said crystal growth apparatus also having a reflector positioned within the crucible above the melt, said reflector having an inner surface defining a central opening through which the crystal is pulled, said melt having a top surface on which a reflection of the reflector is visible, said crystal being pulled generally along a central axis that is substantially perpendicular to the top surface of the melt, said system comprising:

a camera for generating images of a portion of the reflector and a portion of the reflection of the reflector on the top surface of the melt, said images each including a plurality of pixels, said pixels each having a value representative of an optical characteristic of the image;

an image processor for processing the images as a function of the pixel values to detect at least two edges of the reflector and at least two edges of the reflection in the images, said edges of the reflection corresponding to a virtual image of the reflector;

a control circuit for measuring the distance between the detected edges of the reflector to determine a dimension of the reflector in pixels and measuring the distance between the detected edges of the reflection to determine a dimension of the virtual image of the reflector in pixels, said control circuit further determining a distance from the camera to the reflector and a distance from the camera to the virtual image of the reflector based on the relative positions of the detected edges in the images and determining at least one parameter representative of a condition of the crystal growing apparatus based on the determined distances, said control circuit controlling the crystal growing apparatus in response to the determined parameter.

* * * * *